(12) United States Patent
Iwashita et al.

(10) Patent No.: US 11,688,726 B2
(45) Date of Patent: Jun. 27, 2023

(54) SEMICONDUCTOR DEVICE

(71) Applicant: Kioxia Corporation, Tokyo (JP)

(72) Inventors: Yasunori Iwashita, Yokkaichi Mie (JP); Shinya Arai, Yokkaichi Mie (JP); Keisuke Nakatsuka, Kobe Hyogo (JP); Takahiro Tomimatsu, Nagoya Aichi (JP); Ryo Tanaka, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 74 days.

(21) Appl. No.: 17/189,955

(22) Filed: Mar. 2, 2021

(65) Prior Publication Data

US 2022/0085003 A1 Mar. 17, 2022

(30) Foreign Application Priority Data

Sep. 17, 2020 (JP) ................................. 2020-156722

(51) Int. Cl.
*H01L 25/18* (2023.01)
*H01L 23/00* (2006.01)

(52) U.S. Cl.
CPC ............. *H01L 25/18* (2013.01); *H01L 24/06* (2013.01); *H01L 24/20* (2013.01); *H01L 24/82* (2013.01); *H01L 2224/06151* (2013.01); *H01L 2224/221* (2013.01); *H01L 2224/224* (2013.01); *H01L 2224/8234* (2013.01); *H01L 2924/1431* (2013.01); *H01L 2924/1438* (2013.01)

(58) Field of Classification Search
CPC ................. H01L 25/18; H01L 25/0657; H01L 2224/224; H01L 2924/1431; H01L 2924/1434–1453
See application file for complete search history.

(56) References Cited

U.S. PATENT DOCUMENTS

| | | | |
|---|---|---|---|
| 2016/0007916 A1 | 1/2016 | Iwawaki | |
| 2020/0350321 A1 | 11/2020 | Cheng et al. | |
| 2021/0257266 A1* | 8/2021 | Oh | G11C 29/48 |
| 2021/0375790 A1* | 12/2021 | Oda | H01L 24/08 |

FOREIGN PATENT DOCUMENTS

CN 110870062 A 3/2020

* cited by examiner

Primary Examiner — Tucker J Wright
(74) Attorney, Agent, or Firm — Foley & Lardner LLP (57) ABSTRACT

According to one embodiment, a semiconductor device includes a first chip, and a second chip bonded to the first chip. The first chip includes: a substrate; a transistor provided on the substrate; a plurality of first wirings provided above the transistor; and a plurality of first pads provided above the first wirings. The second chip includes: a plurality of second pads coupled to the plurality of first pads, respectively; a plurality of second wirings provided above the second pads; and a memory cell array provided above the second wirings. The first wiring, the first pad, the second pad, and the second wiring are coupled to one another in series to form a first pattern.

6 Claims, 8 Drawing Sheets

SEMICONDUCTOR DEVICE

CROSS-REFERENCE TO RELATED APPLICATION

This application is based upon and claims the benefit of priority from Japanese Patent Application No. 2020-156722, filed Sep. 17, 2020, the entire contents of which are incorporated herein by reference.

FIELD

Embodiments described herein relate generally to a semiconductor device.

BACKGROUND

A wafer bonding technique can be used to bond a plurality of semiconductor wafers to one another with a plurality of wirings. In the wafer bonding technique, when the wiring pad is recessed from the surface of the semiconductor wafer, it is likely that poor connection between the wirings may occur.

DETAILED DESCRIPTION

Embodiments provide a semiconductor device capable of preventing poor connection between wirings.

In general, according to one embodiment, a semiconductor device includes a first chip, and a second chip bonded to the first chip. The first chip includes: a substrate; a transistor provided on the substrate; a plurality of first wirings provided above the transistor; and a plurality of first pads provided above the first wirings. The second chip includes: a plurality of second pads coupled to the plurality of first pads, respectively; a plurality of second wirings provided above the second pads; and a memory cell array provided above the second wirings. The first wiring, the first pad, the second pad, and the second wiring are coupled to one another in series to form a first pattern.

Hereinafter, embodiments according to the present disclosure will be described with reference to the drawings. The embodiments do not limit the present disclosure. The drawings are schematic or conceptual, and the proportions or the like between components are not necessarily same as the actual values thereof. In the specification and the drawings, components similar to those described hereinabove with respect to the drawings are denoted by the same reference numerals, and detailed description thereof will be omitted as appropriate.

Figure 1:
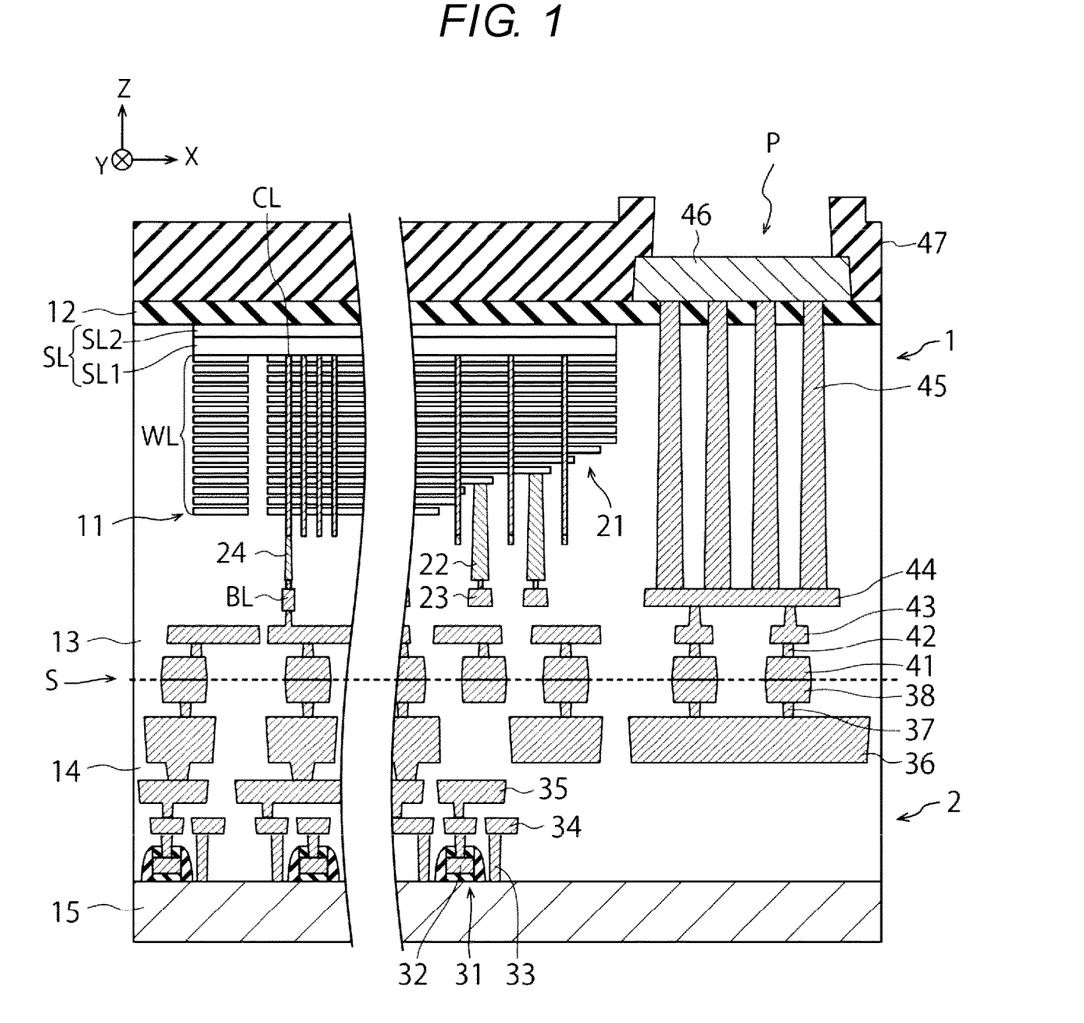
FIG. 1 shows a cross-sectional view of a structure of a semiconductor device of the present embodiment.

FIG. 1 is a cross-sectional view showing the structure of a semiconductor device of the present embodiment. The semiconductor device of FIG. 1 includes a three-dimensional memory, in which an array chip 1 and a circuit chip 2 are bonded together. The semiconductor device is, for example, a NAND flash memory. The circuit chip 2 is an example of the first chip, and the array chip 1 is an example of the second chip.

The array chip 1 includes a memory cell array 11 including a plurality of memory cells, an insulating film 12 on the memory cell array 11, and an interlayer insulating film 13 below the memory cell array 11. The insulating film 12 is, for example, a silicon oxide film or a silicon nitride film. The interlayer insulating film 13 is, for example, a silicon oxide film or a stacked film including a silicon oxide film and another insulating film.

The circuit chip 2 is provided below the array chip 1. A reference sign S indicates a bonding surface (or interface) between the array chip 1 and the circuit chip 2. The circuit chip 2 includes an interlayer insulating film 14 and a substrate 15 below the interlayer insulating film 14. The interlayer insulating film 14 is, for example, a silicon oxide film or a stacked film including a silicon oxide film and another insulating film. The substrate 15 is, for example, a semiconductor substrate such as a silicon substrate.

FIG. 1 shows the X and Y directions parallel to the surface of the substrate 15 and perpendicular to each other, and the Z direction perpendicular to the surface of the substrate 15. In the present specification, the +Z direction is treated as an upward direction, and the −Z direction is treated as a downward direction. The −Z direction may or may not coincide with the direction of gravity.

The array chip 1 includes a plurality of word line WLs and a source line SL as an electrode layer in the memory cell array 11. FIG. 1 shows a stepped structure portion 21 of the memory cell array 11. Each word line WL is electrically connected to the word wiring layer 23 via a contact plug 22. Each columnar portion CL penetrating the plurality of word line WLs is electrically connected to a bit line BL via the via plug 24, and is also electrically connected to the source line SL. The source line SL includes a first source layer SL1 which is a semiconductor layer and a second source layer SL2 which is a metal layer. The memory cell array 11 is, for example, a three-dimensional memory cell array in which a plurality of memory cells are three-dimensionally arranged.

The circuit chip 2 includes a plurality of transistors 31. Each transistor 31 includes a gate electrode 32 provided on the substrate 15 via a gate insulating film, and a source diffusion layer and a drain diffusion layer (not shown) provided in the substrate 15. The transistors 31 can collectively constitute a logic circuit such as a complementary metal oxide semiconductor (CMOS) circuit. This CMOS circuit controls the array chip 1. Further, the circuit chip 2 includes a plurality of contact plugs 33 provided on the gate electrode 32, the source diffusion layer, or the drain diffusion layer of the transistor 31, wiring layers 34 provided on the contact plugs 33 and including a plurality of wirings, and a wiring layer 35 provided on the wiring layer 34 and including a plurality of wirings.

The circuit chip 2 further includes a wiring layer 36 provided on the wiring layer 35 and including the plurality of wirings, a plurality of via plugs 37 provided on the wiring layer 36, and the plurality of metal pads 38 provided on the via plugs 37. The wiring layer 36 as the first wiring is provided above the logic circuit composed of the transistors 31. For the wiring layer 36, for example, copper (Cu) or aluminum (Al) is used. The metal pad 38 as the first pad is provided above the wiring layer 36. It is desirable that the metal pad 38 is substantially flush with the interlayer insulating film 14 in order to be joined to a metal pad 41 of the array chip 1 on the bonding surface S. For the metal pad 38, for example, copper (Cu) or aluminum (Al) is used. The metal pad 38 includes an active pad and a dummy pad. The via plug 37 as a first via contact is provided between the wiring layer 36 and the metal pad 38, and electrically connects the wiring layer 36 and the metal pad 38 to each other. As described above, the circuit chip 2 functions as a control circuit (logic circuit) that controls the operation of the array chip 1. The control circuit is composed of the transistors 31 and the like, and is electrically connected to the metal pads 38.

The array chip 1 includes a plurality of the metal pads 41 provided on the metal pads 38, and a plurality of via plugs 42 provided on the metal pads 41. Further, the array chip 1 includes a wiring layer 43 provided on the via plugs 42 and including a plurality of wirings, and a wiring layer 44 provided on the wiring layer 43 and including a plurality of wirings. It is desirable that the metal pad 41 as the second pad is substantially flush with the interlayer insulating film 13 in order to be joined to the metal pad 38 of the circuit chip 2 on the bonding surface S. For the metal pad 41, for example, Cu or Al is used. The metal pad 41 includes an active pad and a dummy pad. The wiring layer 43 as the second wiring is provided above the metal pad 41. For the wiring layer 43, for example, Cu or Al is used. The via plug 42 as a second via contact is provided between the wiring layer 43 and the metal pad 41, and electrically connects the wiring layer 43 and the metal pad 41 to each other. Other wirings, via plugs, the memory cell array 11, and the like are provided above the wiring layer 43. Details of the wiring layers 36 and 43, the via plugs 37 and 42, and the metal pads 38 and 41 will be described later. The via plugs 37 and 42 are not necessarily have to be provided. In this case, the wiring layer 36 may be directly connected to the metal pad 38 without the via plug 37. The wiring layer 43 may be directly connected to the metal pad 41 without the via plug 42.

The array chip 1 further includes a plurality of via plugs 45 provided on the wiring layer 44, metal pads 46 provided on the via plugs 45 and on the insulating film 12, and a passivation film 47 provided on the metal pads 46 and on the insulating film 12. The metal pad 46 is formed by using, for example, Cu or Al, and functions as an external connection pad (bonding pad) of the semiconductor device shown in FIG. 1. The passivation film 47 is, for example, an insulating film such as a silicon oxide film, and has an opening P that exposes the upper surface of the metal pad 46. The metal pad 46 can be connected to amounting substrate or other devices by a bonding wire, a solder ball, a metal bump, or the like via the opening P.

Figure 2:
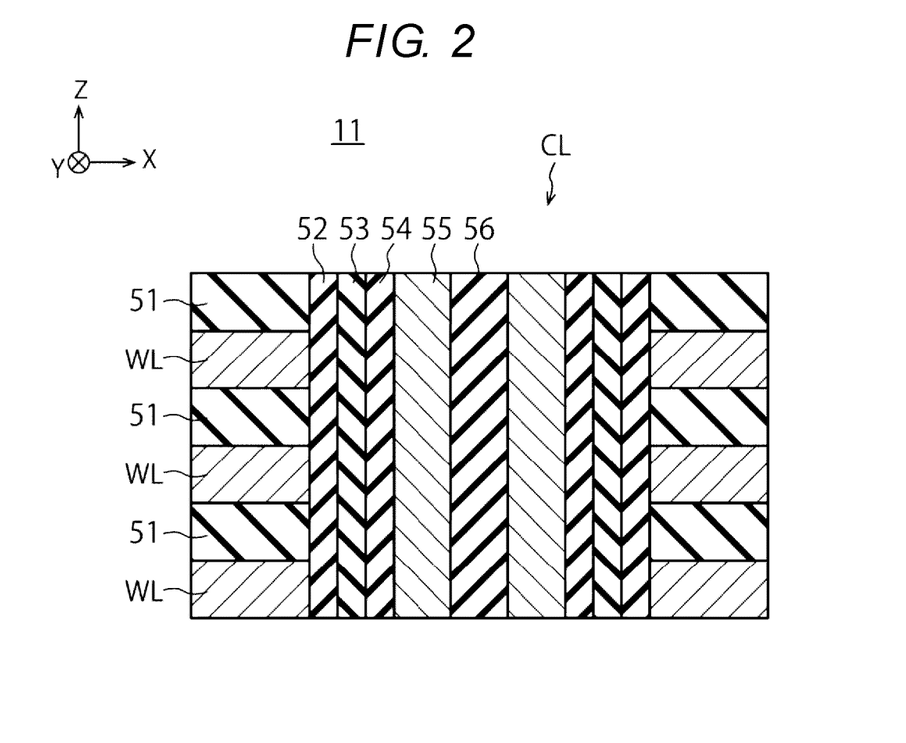
FIG. 2 shows a cross-sectional view of a structure of the columnar portion of the present embodiment.

FIG. 2 is a cross-sectional view showing the structure of the columnar portion CL of the present embodiment.

As shown in FIG. 2, the memory cell array 11 includes a plurality of word line WLs and a plurality of insulating layers 51 which are alternately stacked on the interlayer insulating film 13 (FIG. 1). The word line WL is, for example, a tungsten (W) layer. The insulating layer 51 is, for example, a silicon oxide film.

The columnar portion CL includes a block insulating film 52, a charge storage layer 53, a tunnel insulating film 54, a channel semiconductor layer 55, and a core insulating film 56 in this order. The charge storage layer 53 is, for example, a silicon nitride film, and is formed on the side of the word line WL and the insulating layer 51 with the block insulating film 52 interposed therebetween. The charge storage layer 53 may be a semiconductor layer such as a polysilicon layer. The channel semiconductor layer 55 is, for example, a polysilicon layer, and is formed on the side of the charge storage layer 53 with the tunnel insulating film 54 interposed therebetween. The block insulating film 52, the tunnel insulating film 54, and the core insulating film 56 are, for example, silicon oxide films or metal insulating films.

Figure 3:
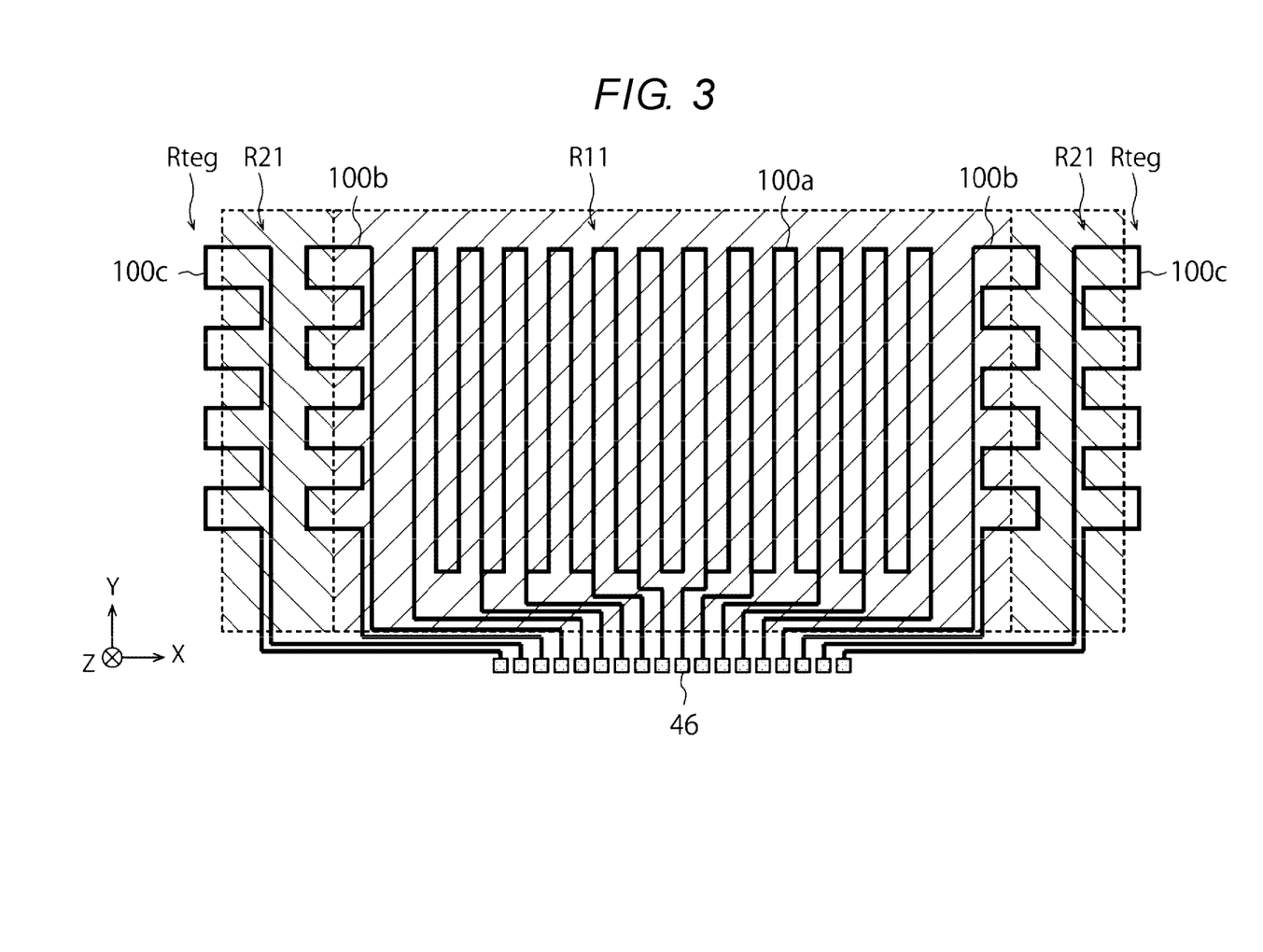
FIG. 3 shows a schematic plan view of an arrangement of chain patterns of the present embodiment.

FIG. 3 is a schematic plan view showing an arrangement of chain patterns of the present embodiment. FIG. 3 shows a schematic plane of the array chip 1 when viewed from a direction substantially perpendicular to the bonding surface S (Z direction).

The chain patterns 100a to 100c as the first pattern are test element group (TEG) patterns for detecting a poor connection of the wiring joint portion between the array chip 1 and the circuit chip 2. The chain patterns 100a to 100c are patterns in which the metal pad 41, the via plug 42, and the wiring layer 43 of the array chip 1, and the wiring layer 36, the via plug 37, and the metal pad 38 of the circuit chip 2 are continuously connected as described later with reference to FIG. 5, and are electrically connected to each other at the joint portion between the metal pad 41 and the metal pad 38 in FIG. 1.

A memory cell array region R11 is a region in which the memory cell array 11 is provided. A stepped region R21 is a region in which the stepped structure portion 21 at the end of the memory cell array 11 is provided. A TEG region Rteg is provided outwardly from the stepped region R21. The TEG region Rteg is not provided with a semiconductor element such as the memory cell array 11, but is provided with a test pattern.

The chain pattern 100a is provided in the memory cell array region R11 and is overlapped with the memory cell array 11 in a plan view seen from the Z direction. The chain pattern 100a is a test pattern for detecting a poor junction between the metal pad 38 and the metal pad 41 below the memory cell array 11. The metal pad 41 of the chain pattern 100a is provided on the same layer as the metal pad used for the memory cell array 11, but is provided as a metal pad for the test pattern without being connected with the memory cell array 11.

The chain pattern 100b is overlapped with both the memory cell array 11 and the stepped structure portion 21 provided at the end of the memory cell array 11, in a plan view viewed from the Z direction. That is, the chain pattern 100b is provided in a zigzag shape at the boundary between the memory cell array region R11 and the stepped region R21. At the end of the memory cell array 11, metal pads 38 and 41 used for a drain-side select gate connecting the bit line and a memory string are provided. The chain pattern 100b is a test pattern for detecting a poor junction between the metal pad 38 and the metal pad 41 used for the drain-side select gate.

The chain pattern 100c is overlapped with both the stepped structure portion 21 and the TEG region Rteg as a test region around the stepped structure portion 21, in a plan view viewed from the Z direction. That is, the chain pattern 100c is provided in a zigzag shape at the boundary between the stepped region R21 and the TEG region Rteg. The chain pattern 100c detects a poor junction between the metal pad 38 and the metal pad 41 in the stepped structure portion 21 and the TEG region Rteg.

The structure of the array chip 1 changes at the boundary between the memory cell array region R11 and the stepped region R21 and the boundary between the stepped region R21 and the TEG region Rteg. This change in structure may cause the poor connection of the metal pads 38 and 41. Therefore, in the present embodiment, the chain patterns 100a to 100c are arranged not only at the memory cell array region R11 but also at the boundary between the memory cell array region R11 and the stepped region R21, or at the boundary between the memory cell array region R11 and the TEG region Rteg. This makes it easier to detect the poor connection of the metal pads 38 and 41.

The metal pads 46 are provided in the TEG region Rteg. The metal pads 46 as the third or fourth pads allow the array chip 1 and the circuit chip 2 to be connected to external devices. The metal pads 46 are connected to the ends of the chain patterns 100a to 100c, and are provided in order to input a test signal to the chain patterns 100a to 100c from the outside. For example, the metal pads 46 are connected to both ends of each of the chain patterns 100a to 100c. Electric power is applied between the metal pads 46 at one ends of the chain patterns 100a to 100c and the metal pads 46 at the other ends thereof, and a resistance value of each of the chain patterns 100a to 100c is measured. When the resistance value is larger than a predetermined threshold value, it can be determined that poor connection occurs between the metal pad 38 and the metal pad 41.

Figure 4:
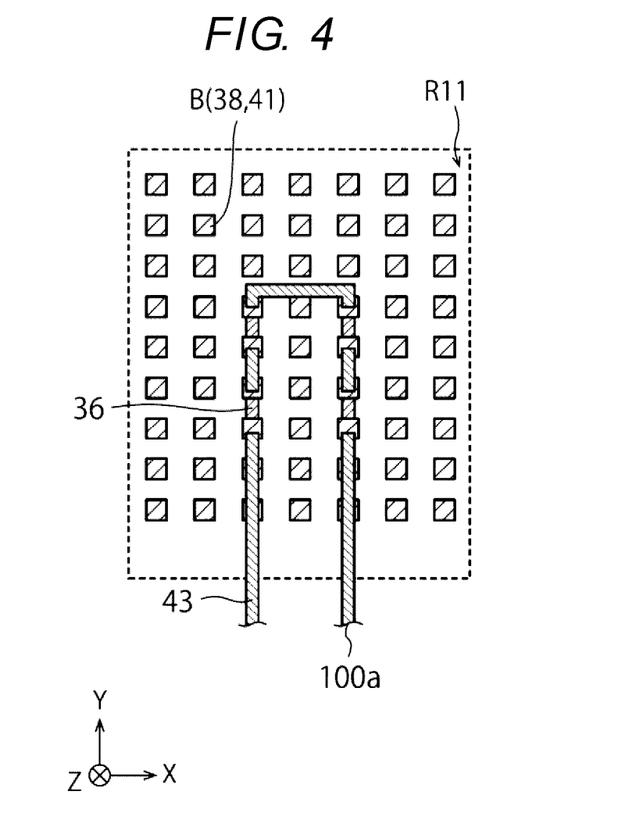
FIG. 4 shows a schematic plan view of a configuration of a chain pattern.
Figure 5:
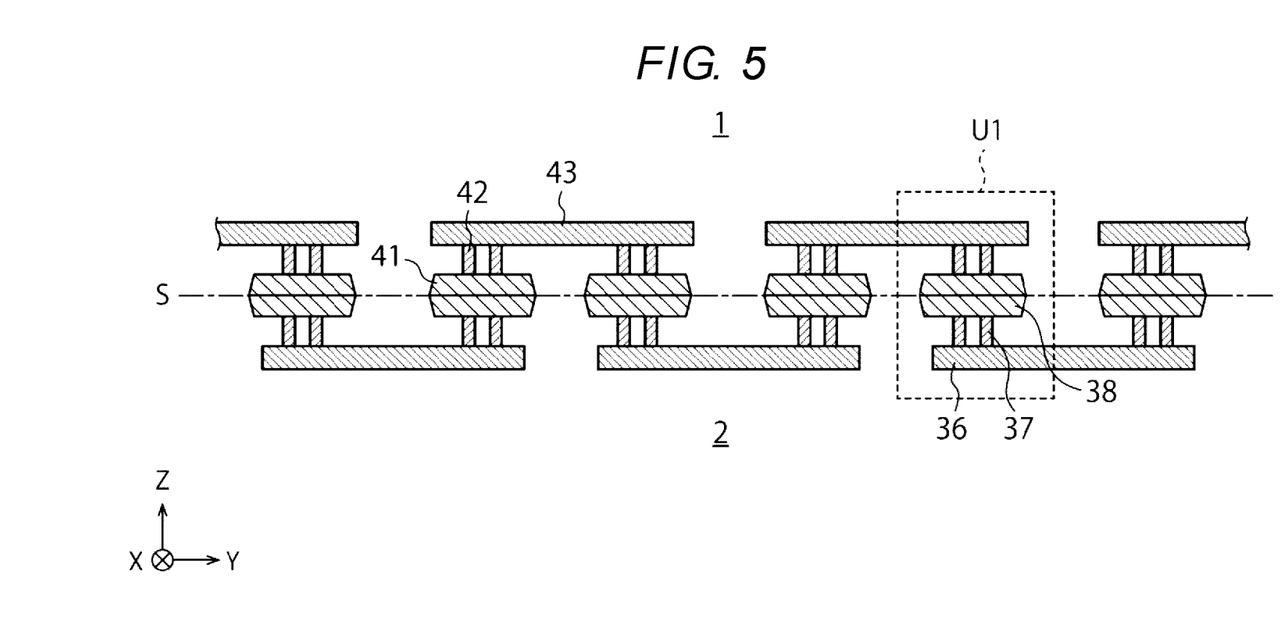
FIG. 5 shows a schematic cross-sectional view of the chain pattern of FIG. 4.

FIG. 4 is a schematic plan view showing a configuration of the chain pattern. FIG. 4 shows the schematic plane of the chain pattern 100a viewed from the Z direction. FIG. 5 is a schematic cross-sectional view of the chain pattern of FIG. 4.

As shown in FIG. 5, the chain patterns 100a to 100c (hereinafter, collectively referred to as the chain pattern 100) has a configuration in which the wiring layer 36, the via plug 37, the metal pad 38, the metal pad 41, the via plug 42, and the wiring layer 43 are continuously connected in series in this order.

The chain pattern 100 has a unit chain structure U1 in which the wiring layer 36, the via plug 37, the metal pad 38, the metal pad 41, the via plug 42, and the wiring layer 43 are connected in series one by one. The chain pattern 100 may have only one unit chain structure U1 or may be configured by connecting a plurality of unit chain structures U1 in series. The unit chain structure U1 includes one joint portion between the metal pad 38 and the metal pad 41. Therefore, the chain pattern 100 includes the same number of joint portions as the number of unit chain structures U1 connected in series. By testing the chain pattern 100, the joint portion of the unit chain structure U1 in the chain pattern 100 can be tested.

The number of unit chain structures U1 connected in series to one chain pattern 100 is not particularly limited. However, the number of the chain patterns 100 connected in series may be 1 or more, and may be $10 \times 10^3$ to $10 \times 10^6$.

A joint portion B shown in FIG. 4 is a joint portion between the metal pad 38 and the metal pad 41. The via plugs 37 and 42 are overlapped with the joint portion B and are not shown in FIG. 4. The wiring layer 36 and the wiring layer 43 are alternately connected to a plurality of adjacent joint portions B. Further, the wiring layer 36 or 43 extends from the metal pad 46 to the joint portion B as shown in FIG. 3, and is connected between the metal pad 46 and the metal pad 41 of the joint portion B. The wiring position and wiring length of the chain pattern 100 are optional, and are not particularly limited. However, although not shown in FIG. 4, it is desirable that the chain patterns 100b and 100c cross the boundary between the memory cell array region R11 and the stepped region R21 and the boundary between the stepped region R21 and the TEG region Rteg in a reciprocating manner in the X direction. In this way, the chain patterns 100b and 100c can efficiently test the poor connection at the boundaries.

Figure 6:
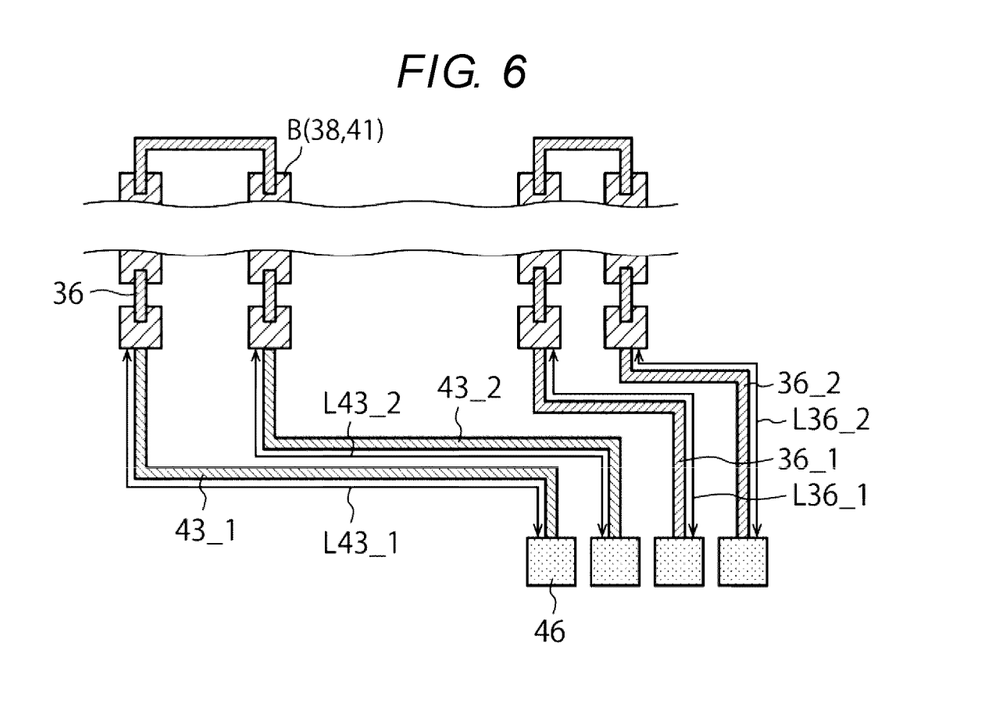
FIG. 6 shows a schematic view of a configuration example of a chain pattern and a metal pad.

FIG. 6 is a schematic view showing a configuration example of the chain pattern 100 and the metal pad 46.

The wiring layer 43 includes the wiring layers 43_1 and 43_2. The wiring layers 43_1 and 43_2 are wirings from the joint portions B at both ends of the chain pattern 100 to the metal pads 46, and are wirings at the ends of the chain pattern 100. The wiring layers 43_1 and 43_2 are the wiring layer 43 from the metal pads 46 used for connection to the outside to the first (or last) joint portions B. Alternatively, the wiring layers 43_1 and 43_2 may be referred to as the wiring layer 43 from the metal pads 46 to the first (or last) metal pad 38 or 41.

The wiring layer 36 includes wiring layers 36_1 and 36_2. The wiring layers 36_1 and 36_2 are wirings from the joint portions B at both ends of the chain pattern 100 to the metal pads 46, and are wirings at the ends of the chain pattern 100. The wiring layers 36_1 and 36_2 are the wiring layer 36 from the metal pads 46 used for connection to the outside to the first (or last) joint portions B. Alternatively, the wiring layers 36_1 and 36_2 may be referred to as the wiring layer 36 from the metal pads 46 to the first (or last) metal pad 38 or 41.

Figure 7:
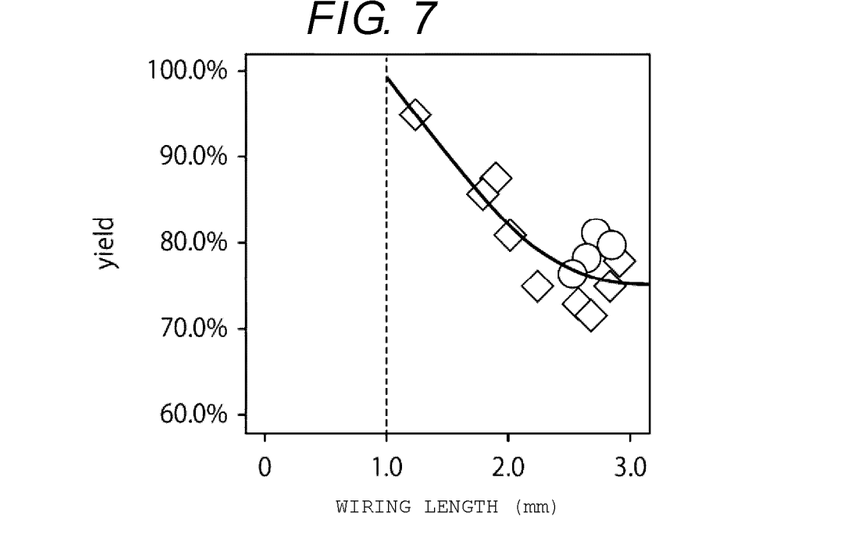
FIG. 7 is a graph showing a relationship between a wiring length and a yield of a joint portion.

Let the lengths of the wiring layers 43_1 and 43_2 be L43_1 and L43_2, respectively. Let the lengths of the wiring layers 36_1 and 36_2 be L36_1 and L36_2, respectively. At this time, it was found that a relationship between the wiring lengths L43_1, L43_2, L36_1, and L36_2 and a poor junction rate is as shown in the graph of FIG. 7. Further, it was found that a relationship between each of the lengths of the wiring layer 36 between the bonding pad 38 and the bonding pad 41 and the wiring layer 36 between the other bonding pads and the poor junction rate has the same relationship.

FIG. 7 is a graph showing a relationship between the wiring lengths L43_1, L43_2, L36_1, L36_2 and a yield of the joint portion B. From the graph, it can be seen that yield decreases as the wiring lengths L43_1, L43_2, L36_1, and L36_2 are long. It means that as wiring lengths L43_1, L43_2, L36_1, and L36_2 of the wiring layers 36 and 43 at the end of each of the chain patterns 100 are long, the poor junction between the metal pad 41 and the metal pad 38 at the joint portion B increases. For example, when the wiring lengths L43_1, L43_2, L36_1, and L36_2 of the wiring layers 36 and 43 exceed 1 mm, the yield begins to decrease. Therefore, it is desirable that the wiring lengths L43_1, L43_2, L36_1, and L36_2 of the wiring layers 36 and 43 are 1 mm or less. Further, when each of the lengths of the wiring layer 36 between the bonding pad 38 and the bonding pad 41 and the wiring layer 36 between the other bonding pads also exceeds 1 mm, the yield also begins to decrease.

That is, it is desirable that the lengths L36_1 and L36_2 of the wiring layer 36 from the metal pad 46 to the via plug 37 are 1 mm or less. It is desirable that the lengths L43_1 and L43_2 of the wiring layer 43 from the metal pad 46 to the via plug 42 are 1 mm or less. Further, it is desirable that each of the lengths of the wiring layer 36 between the bonding pad 38 and the bonding pad 41 and the wiring layer 36 between the other bonding pads is also 1 mm or less. In this way, the poor junction between the metal pad 41 and the metal pad 38 is reduced, leading to an improvement in yield. It was found that the poor junction does not depend on the chain scale of the chain pattern 100 (the number of connected unit chain structures U1).

Next, the poor junction between the metal pad 41 and the metal pad 38 will be described.

Figure 8:
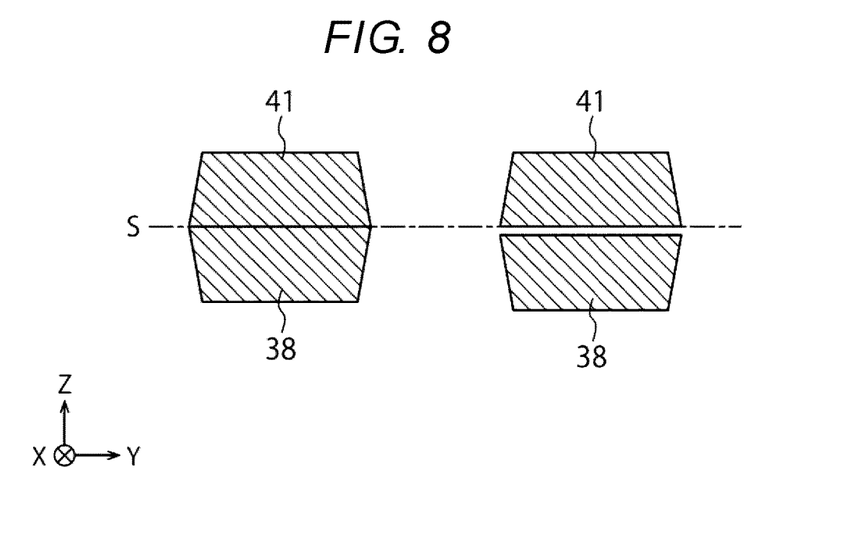
FIG. 8 shows a schematic cross-sectional view of an example of a poor junction between metal pads.

FIG. 8 is a schematic cross-sectional view showing an example of a poor junction between the metal pad 41 and the metal pad 38. The metal pad 38 and the metal pad 41 on the left of FIG. 8 are normally joined to each other on the bonding surface S. The metal pad 38 and the metal pad 41 on the right of FIG. 8 are separated from each other on the bonding surface S, resulting in the poor junction. This is because the materials of the metal pads 38 and/or 41 are scraped by corrosion in a process such as chemical mechanical polishing (CMP).

Figure 9:
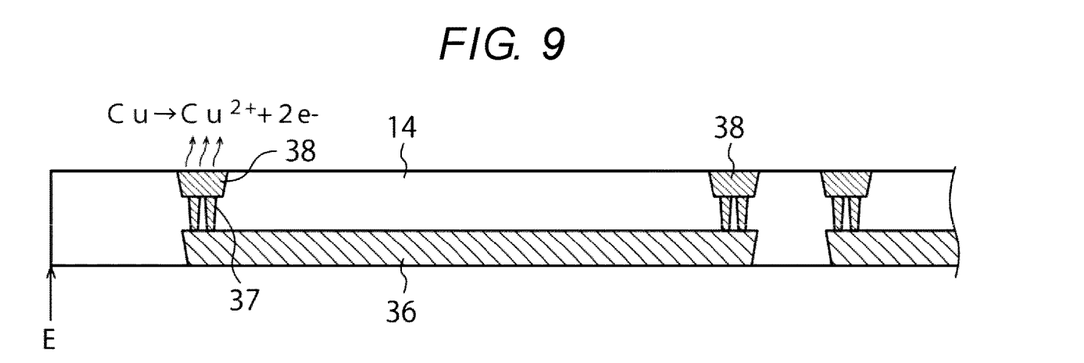
FIG. 9 shows a state of dishing of a metal pad of a circuit chip.
Figure 10:
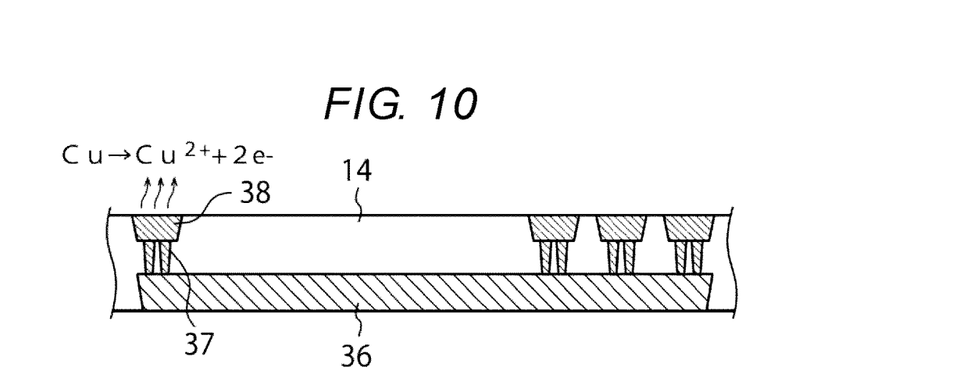
FIG. 10 shows a state of dishing of a metal pad of a circuit chip.

FIGS. 9 and 10 are views showing states of dishing of the metal pad 38 of the circuit chip 2. Although the circuit chip 2 will be described in FIGS. 9 and 10, the same applies to the dishing of the metal pad 41 of the array chip 1.

Before bonding the array chip 1 and the circuit chip 2, in the previous step, the metal pad 38 and the interlayer insulating film 14 are polished and flattened by using the CMP method. In the CMP step, the metal pad 38 is not only physically polished by a polishing pad, but also is chemically polished by a slurry contacting the metal pad 38. For example, copper, which is the material of the metal pad 38, is scraped by the slurry by a chemical reaction of $Cu \rightarrow Cu^{2+} + 2e^-$. The chemical reaction between the slurry and the materials of the metal pads 38 (for example, copper) changes depending on the arrangement density of the metal pads 38 (exposed area of the metal pad 38 per unit area). That is, in the region where the arrangement density of the metal pads 38 is high, the slurry is used for polishing many metal pads 38, and thus the chemical potential of the slurry is made low. On the other hand, in the region where the arrangement density of the metal pads 38 is low, the slurry is used only for polishing a small number of metal pads 38, and thus the chemical potential of the slurry remains high. Therefore, in the region where the arrangement density of the metal pads 38 is high, the metal pads 38 are not scraped so much and dishing is unlikely to occur. On the other hand, in the region where the arrangement density of the metal pads 38 is low, the metal pads 38 are easily scraped and dishing is likely to occur. The same can be said for the metal pads 41 of the array chip 1.

Therefore, for example, as shown in FIG. 9, at the end E of the semiconductor chip or the semiconductor wafer, the metal pads 38 and 41 are often recessed, and a poor junction is likely to occur. Furthermore, as shown in FIG. 10, the metal pads 38 and 41 are often recessed in low density regions as compared with high density regions of the metal pads 38 and 41, and a poor junction is likely to occur.

Figure 11:
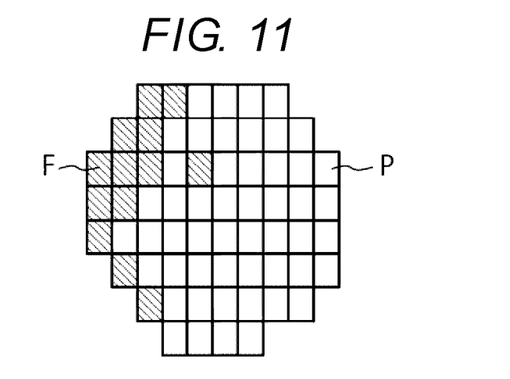
FIG. 11 shows positions of poorly joined chips on a surface of a semiconductor wafer after bonding.
Figure 12:
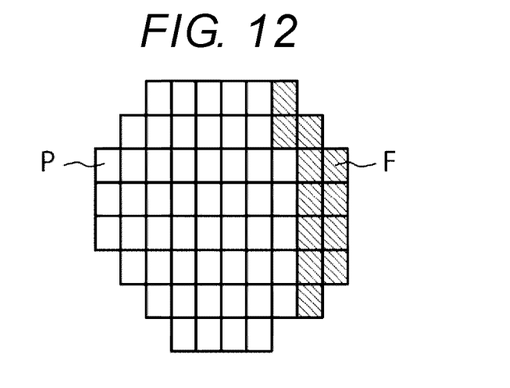
FIG. 12 shows positions of poorly joined chips on a surface of a semiconductor wafer after bonding.

FIGS. 11 and 12 are views showing positions of poorly joined chips on the surface of the semiconductor wafer after bonding. With reference to FIGS. 11 and 12, it can be seen that poor junctions are caused in semiconductor chips at the end of the semiconductor wafer.

As described above, by setting the lengths L36_1 and L36_2 of the wiring layer 36 from the metal pads 46 to the via plugs 37 to 1 mm or less, the dishing of the metal pads 38 is prevented. This is because the exposure densities of the metal pads 38 and 46 are reduced by reducing the length of the wiring layers 36 and 43 to 1 mm or less. The same applies to each of the lengths L43_1 and L43_2 of the wiring layer 43 from the metal pads 46 to the via plugs 42 and the wiring layer 36 between the bonding pads 38 and the bonding pads 41 and the wiring layer between the other bonding pads. As a result, the semiconductor device according to the present embodiment can prevent the poor junction between wirings and improve the yield.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a first chip; and
   a second chip bonded to the first chip in a first direction, wherein
   the first chip includes:
      a substrate;
      a transistor provided on the substrate;
      a plurality of first wirings provided above the transistor and extending in a second direction crossing the first direction; and
      a plurality of first pads provided above the first wirings, the second chip includes:
      a plurality of second pads coupled to the plurality of first pads, respectively;
      a plurality of second wirings provided above the second pads and extending in the second direction; and
      a memory cell array provided above the second wirings;
   a third pad connected to at least one of the first wirings; and
   a fourth pad connected to at least one of the second wirings,
   wherein a length of the at least one first wiring extending from the third pad to a first or last of either the first or second pads is equal to or less than 1 mm in the second direction;
   wherein a length of the at least one second wirings extending from the fourth pad to the first or last of either the first or second pads is equal to or less than 1 mm, and
   wherein the first wiring, the first pad, the second pad, and the second wiring form a first pattern, the first pattern having the following order of connections: the first wiring, the first pad, the second pad, and the second wiring connected to each other in series.

2. The semiconductor device according to claim 1, wherein the first pattern overlaps with the memory cell array, when viewed from the top.

3. The semiconductor device according to claim 1, wherein the first pattern overlaps with both of the memory cell array and a stepped structure portion provided at an end of the memory cell array, when viewed from the top.

4. The semiconductor device according to claim 1, wherein the first pattern overlaps with all of the memory cell array, a stepped structure portion provided at an end of the memory cell array, and a test pattern region around the stepped structure portion, when viewed from the top.

5. The semiconductor device according to claim 1, further comprising one or more test chain patterns configured to test connections between the first pads and second pads.

6. The semiconductor device according to claim 5, wherein the one or more test chain patterns are not connected with the memory cell array.

* * * * *